United States Patent
Lee

(10) Patent No.: US 8,735,977 B2
(45) Date of Patent: May 27, 2014

(54) SEMICONDUCTOR DEVICE AND METHOD OF FABRICATING THE SAME

(71) Applicant: SK hynix Inc., Icheon (KR)

(72) Inventor: Dong Min Lee, Icheon-si (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/719,109

(22) Filed: Dec. 18, 2012

(65) Prior Publication Data

US 2014/0015043 A1   Jan. 16, 2014

(30) Foreign Application Priority Data

Jul. 16, 2012   (KR) .......................... 10-2012-0077258

(51) Int. Cl.
*H01L 29/66*   (2006.01)

(52) U.S. Cl.
USPC ..... 257/331; 257/330; 257/332; 257/E29.255

(58) Field of Classification Search
USPC .................................................. 257/330–332
See application file for complete search history.

(56) References Cited

U.S. PATENT DOCUMENTS

| 2006/0220240 A1* | 10/2006 | Lee et al. ........................ 257/734 |
| 2007/0290249 A1* | 12/2007 | Popp et al. ..................... 257/301 |
| 2008/0099835 A1 | 5/2008 | Kim |
| 2009/0075444 A1* | 3/2009 | Kujirai ........................... 438/270 |

FOREIGN PATENT DOCUMENTS

| KR | 10-0861174 B1 | 9/2008 |
| KR | 10-2009-0103508 A | 10/2009 |

* cited by examiner

*Primary Examiner* — A. Sefer

(57) ABSTRACT

A semiconductor device includes active regions defined by a device isolation layer, gates disposed in the active regions of cell channel regions, word lines disposed on the gates and extending along a first direction, and gate contacts configured to connect the gates to the word lines. The gates have a box shape which extends over two active regions.

13 Claims, 6 Drawing Sheets

SEMICONDUCTOR DEVICE AND METHOD OF FABRICATING THE SAME

CROSS-REFERENCES TO RELATED APPLICATION

This application claims priority under 35 U.S.C. 119(a) to Korean application number 10-2012-0077258, filed on 16 Jul. 2012, in the Korean Patent Office, which is incorporated by reference in its entirety.

BACKGROUND OF THE INVENTION

The present invention relates to a semiconductor device, and more particularly, to a semiconductor device capable of preventing a passing gate effect from being generated and a method of fabricating the same.

As the chip size of semiconductor memory, and more particularly dynamic random access memories (DRAM), is increased, the number of chips per wafer is reduced and thus productivity of the device is lowered. Therefore, there are endeavors to reduce a cell area by changing a cell layout to integrate more memory cells on a wafer. As a result, the cell layout is changed from the $8F^2$ structure to $6F^2$ structure.

FIG. 1 is a view illustrating a layout of a semiconductor device having the $6F^2$ layout structure in the related art.

In the semiconductor device having the $6F^2$ layout structure, an active region is obliquely defined in a semiconductor substrate, and a gate and a bit line are formed in a line shape to orthogonally cross each other on the substrate in which the active region is defined. Two line shaped buried gates BG are disposed to pass through each active region, and the bit line BL is disposed to orthogonally cross the buried gate BG and to pass through a central portion of the active region. A bit line contact plug is formed in each active region between the two gates BG, and a storage node contact plug is formed in portions of the active region at outer sides of the two buried gates. All of the storage node contact plug and the bit line contact plug are disposed in the active region in the $6F^2$ layout structure, and thus the integration degree is increased compared with an $8F^2$ structure.

Since each gate is formed in the line shape, a portion of the gate is disposed in the active region to be used for forming a channel and a portion of the gate is formed in a device isolation region to pass by the active region.

The gate that passes through several active regions may be referred to as a passing gate. A passing gate may cause a passing gate effect in which a gate passes through active regions that are turned on and turned off, and the turned on conditions influence a voltage of the turned off regions by lowering the turn-on voltage for influenced regions.

Further, a passing gate may cause a "0" failure in a word line disturb (DIST) test.

SUMMARY

One or more embodiments of the present invention include an improved gate structure in a semiconductor device which may prevent a passing gate effect from being generated.

According to one aspect of a first exemplary embodiment, there is provided a semiconductor device. The semiconductor device may include: active regions defined by a device isolation layer; gates disposed in the active regions of cell channel regions to obliquely cross the active regions, each gate extending over two active regions; word lines extending along a first direction over the gates; and buried gate contacts coupling the gates to the word lines.

The semiconductor device may further include bit lines extending in a second direction to cross the word lines.

Two of the active regions that are adjacent to each other in a longitudinal direction are separated by a width extending between adjacent ends of the active regions, and no gate is disposed in the width extending between adjacent ends of the active regions.

Each of the gates may be formed in a box shape, and each of the two active regions are adjacent along the first direction.

The word lines may be disposed over the active regions and the device isolation layer at a fixed distance from the active regions and the device isolation layer.

The gates may include buried gates buried in the active regions.

The gates may include a fin gate with a lower portion disposed between the two active regions and the lower portion of the fin gate is disposed on opposite sides of each of the two active regions.

According to another aspect of an exemplary embodiment, there is provided a semiconductor device. The semiconductor device may include: a first active region, a second active region adjacent to the first active region, and a third active region adjacent to the second active region, each of the first, second, and third active regions defined by a device isolation layer; a first gate disposed on a second channel region of the first active region and a first channel region of the second active region; a second gate disposed in a second channel region of the second active region and a first channel region of the third active region; a first gate contact disposed on the first gate; a second gate contact disposed on the second gate; a first word line disposed over the first gate and coupled to the first gate through the first gate contact; and a second word line disposed over the second gate and coupled to the second gate through the second gate contact, wherein the first gate does not extend past a line defined by third active region, and the second gate does not extend past a line defined by first active region.

According to another aspect of an exemplary embodiment, there is provided a method of fabricating a semiconductor device. The method may include: forming a device isolation layer defining active regions; forming gates buried in the active regions, each gate extending over two active regions; forming gate contacts connected to the gates on the gates; and forming word lines, each of the word lines coupled to gate contacts disposed along a first direction.

The forming gates may include forming a hard mask pattern defining box-shaped regions on the active regions and the device isolation layer, each of the box-shaped regions overlapping two active regions adjacent along the first direction, etching the active regions and the device isolation layer using the hard mask pattern as an etch mask to form recesses in the active regions, and burying a conductive material in lower portions of the recesses.

The method may further include forming a barrier metal on an inner surface of each of the recesses before forming the conductive material.

The forming recesses may include etching the device isolation layer to expose upper surfaces and sides of the etched active regions.

The forming gate contacts may include forming an insulating layer on the gates, etching the insulating layer to form gate contact holes exposing the gates, and forming a conductive material to be buried in the gate contact holes.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
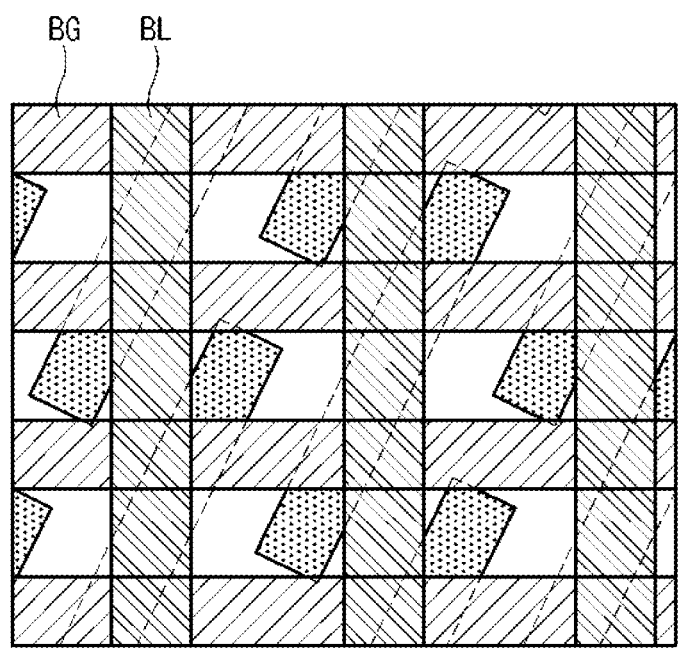
FIG. 1 is a view illustrating a layout of a semiconductor device having a 6F² layout structure in the related art.

Hereinafter, exemplary embodiments will be described in greater detail with reference to the accompanying drawings.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
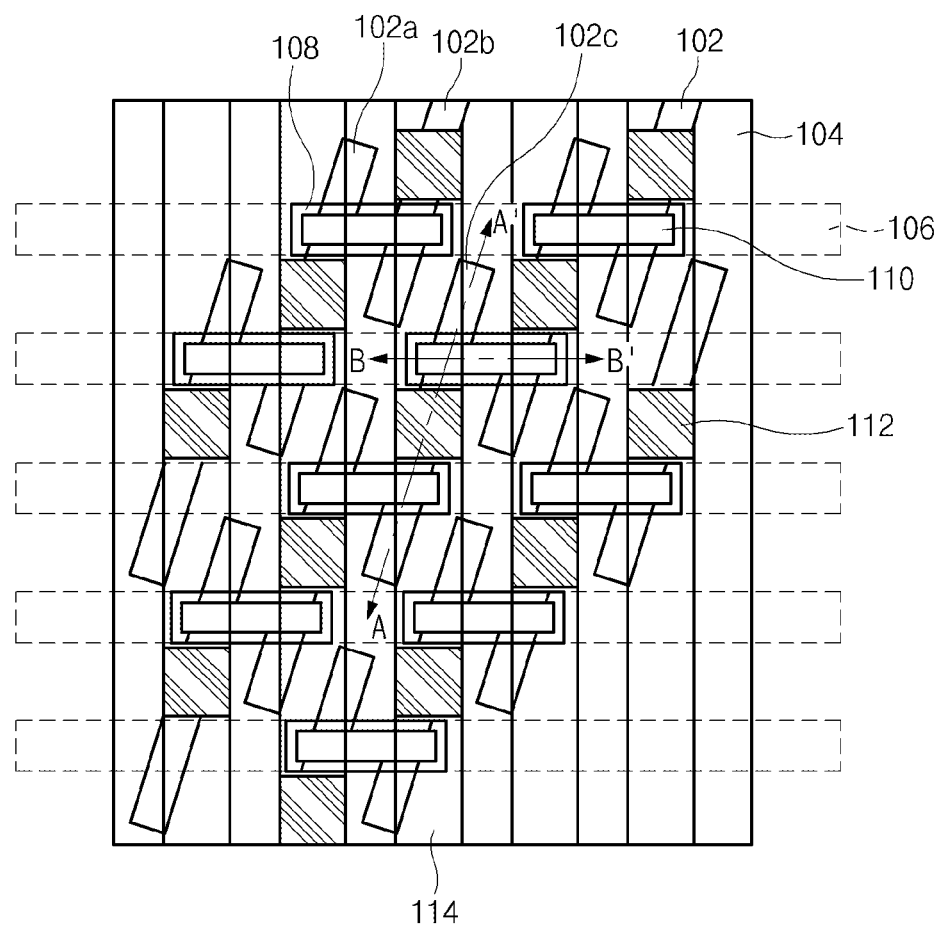
FIG. 2 is a plan view illustrating a structure of a semiconductor device according to an embodiment of the present invention.
Figure 3:
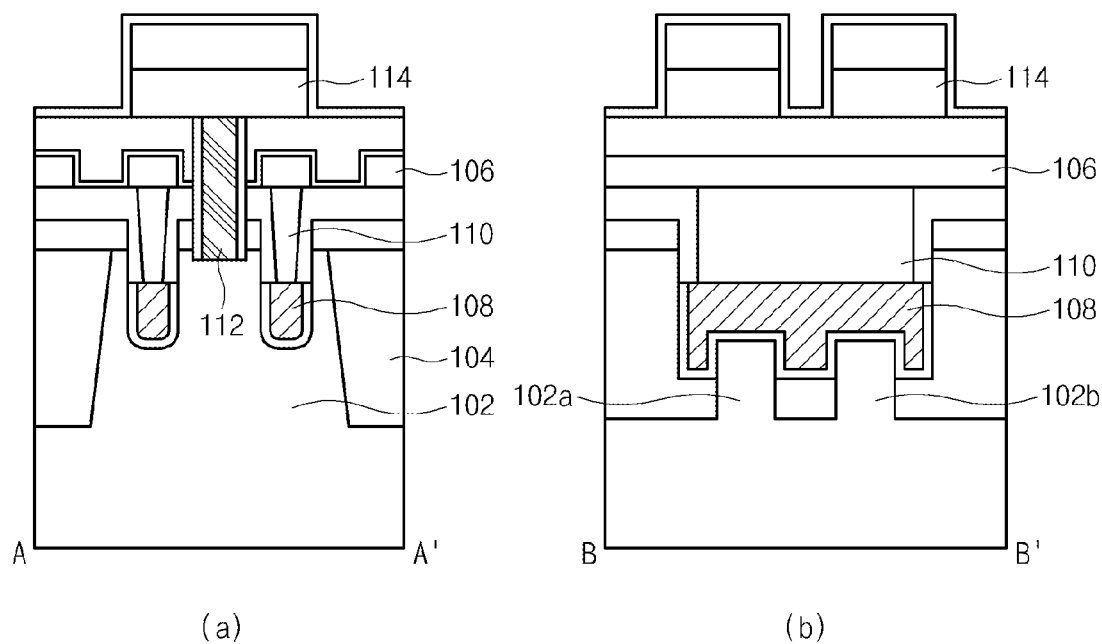
FIG. 3 is a cross-sectional view illustrating a cross-sectional structure of the semiconductor device taken along lines A-A' and B-B' of FIG. 2.

FIG. 2 is a plan view illustrating a structure of a semiconductor device according to an embodiment of the present invention, and FIG. 3 is a cross-sectional view illustrating the structure of the semiconductor device. In FIG. 3, (a) shows a cross-sectional structure taken along line A-A' of FIG. 2 and (b) shows a cross-sectional structure taken along line B-B' of FIG. 2.

Active regions 102a, 102b, 102c, and 102 are defined by a device isolation layer 104 and are arranged obliquely with respect to word lines and bit lines in the 6F² layout. Line-shaped word lines 106, which extend parallel to each other in a first direction and commonly connect buried gates 108, are formed on the active region 102 and the device isolation layer 104. In the embodiment of FIG. 2 and FIG. 3, word lines 106 are formed over active regions including active regions 102a, 102b, 102c, and 102 and the device isolation layer 104 to cross active regions including active regions 102a, 102b, 102c, and 102 in a regular pattern.

Box-shaped buried gates 108, which extend in the same direction as the word lines 106 and are buried to overlap two active regions 102a and 102b adjacent along the extending direction, are provided below each word line 106. A buried gate contact 110, which connects the buried gate 108 and the word line 106, is disposed over the buried gate 108. In the related art, since the buried gate is formed in an elongated line shape crossing a cell region, a gate (passing gate) is formed even in a region in which a cell channel is not formed. In contrast, in an embodiment according to the present invention, the buried gates 108 are formed in a short lengthwise box shape which extends across two active regions, such as the active regions 102a and 102b, in which cell channels are formed. Therefore, the gate 108 is not disposed adjacent to a side of the active region 102c, and thus the passing gate as in the related art is not formed. As seen in FIG. 2, a buried gate 108 overlaps adjacent active regions 102a and 102b, but does not extend past a line defined by active region 102c.

In an embodiment, the buried gate 108 has a length enough to slightly protrude past two active regions 102a and 102b. In other words, the length of buried gate 108 may be greater than the distance between outer sidewalls of two adjacent active regions, and ends of the buried gate 108 may extend past the two active regions. Buried gate 108 may have a fin gate structure in which the buried gate 108 is in contact with upper surfaces and sides of the active regions 102a and 102b as shown in FIG. 3 (b), where the gate overlaps both sidewalls of each of the active regions 102a and 102b.

A bit line contact 112 is located in a central portion of the active region 102 between the buried gates 108. A line-shaped bit line 114 extends to be connected to the bit line contact 112 and to orthogonally crosses the word line 106.

FIGS. 4 to 8 are cross-sectional views illustrating a method of fabricating a semiconductor device having the structure of FIGS. 2 and 3. In FIGS. 4 to 8, (a) shows a cross-sectional view taken along line A-A' of FIG. 2, and (b) shows a cross-sectional view taken along line B-B' of FIG. 2.

Figure 4:
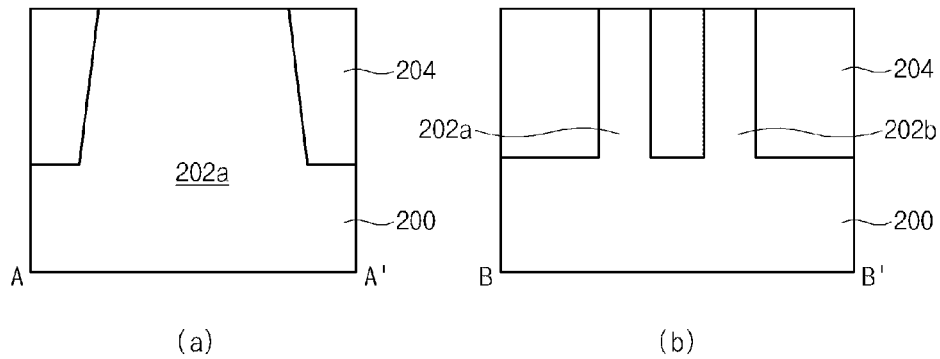
FIGS. 4 to 8 are cross-sectional views illustrating a method of fabricating the semiconductor device having the structure illustrated in FIG. 3.

Referring to FIG. 4, a semiconductor substrate 200 is etched to a constant depth in a device isolation region using a shallow trench isolation (STI) process to form a trench (not shown), and then an insulating layer is formed in the trench to form a device isolation layer 204 defining active regions 202a and 202b. In an embodiment, the device isolation layer 204 may be formed of a spin on dielectric (SOD) layer and formed to a depth of about 3000 Å.

Figure 5:
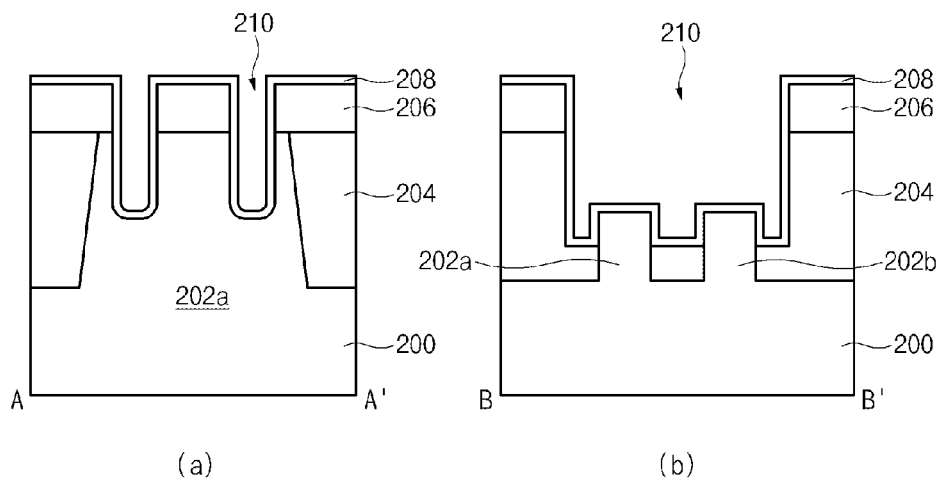

Referring to FIG. 5, a hard mask layer (not shown) is formed on the active regions 202a and 202b and the device isolation layer 204 and then a photoresist pattern (not shown) defining a buried gate region is formed on the hard mask layer through a photo etching process. The buried gate region is a region corresponding to the buried gate indicated by the reference numeral 108 of FIG. 2, and is a box-shaped region having a sufficient length so that the buried gate overlaps two adjacent active regions along an extending direction of a word line to be formed in a subsequent process and slightly protrudes from the active regions. That is, the buried gate region according to an embodiment of the present invention is a short lengthwise box-shaped region crossing two adjacent active regions 202a and 202b in the extending direction of the word line, and not a conventional elongated line crossing a larger number of active regions.

Subsequently, the hard mask layer is etched using the photoresist pattern as an etch mask to form a hard mask pattern 206 and then the active regions 202a and 202b and the device isolation layer 204 are etched using the hard mask pattern 206 as an etch mask to form a recess 210. In an embodiment, a fin structure, in which the active regions 202a and 202b protrude rather than the device isolation layer 204, is formed below the recess 210. That is, the device isolation layer 204 may be etched below the active regions 202a and 202b to expose the upper surfaces and sides of the etched active regions 202a and 202b.

However, a device isolation layer between active regions adjacent in a longitudinal direction of the active region, that is, a device isolation layer of a region in which the passing gate is formed in the related art, may not be etched in embodiments of the present invention. In other words, in an embodiment, there is a space between two active regions 202 which are adjacent in a longitudinal direction, or a direction of the long-axis of the active regions 202. The space is not occupied by an active region, and furthermore, the space is not occupied by a gate. An example of the space between active regions 202 adjacent in a longitudinal direction is the space on FIG. 2 occupied by the letter "B." Thus, in an embodiment, two of the active regions that are adjacent to each other in a longitudinal direction are separated by a width extending between adjacent ends of the active regions, and no gate is disposed in the width extending between adjacent ends of the active regions.

Next, a barrier metal 208 is formed on the semiconductor substrate including an inner surface of the recess 210. The barrier metal 208 prevents metal ions from being diffused to the active region 202 and the device isolation layer 204 when the buried gate is formed of a metal material in a subsequent process. In an embodiment, the barrier metal 208 includes titanium (Ti)/tungsten nitride (WN)/tungsten silicon nitride (WsiN). A gate insulating layer may be formed on a bottom and sidewall of the recess 210 before the barrier metal 208 is formed.

Figure 6:
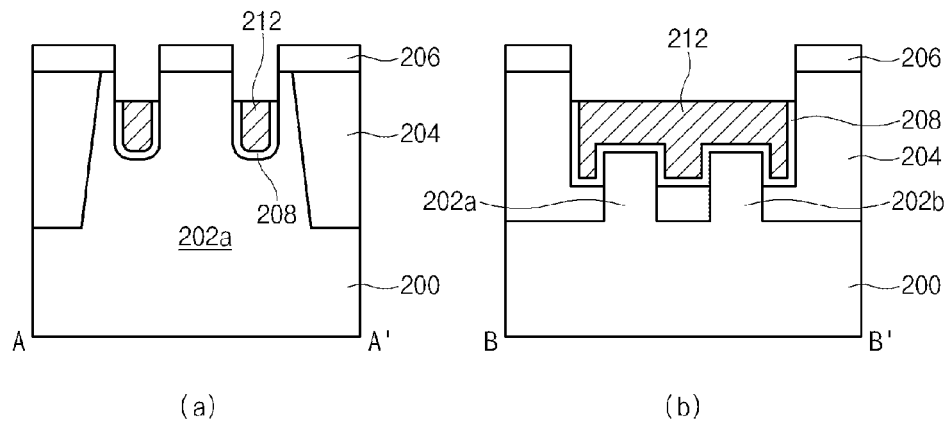

Referring to FIG. 6, a conductive material is formed on the barrier metal 208 in the recess 210 and then etched back to remain in a lower portion of the recess 210 so that a buried gate 212 is formed. In an embodiment, the conductive material for the buried gate 212 may include a metal material such as tungsten (W). In an embodiment, it may be advantageous to ensure a margin in a threshold voltage of a gate using a difference between physical properties related to charge migration between metal and silicon and the like.

When the conductive material is removed through an etch back process, a portion of the barrier metal formed on an upper sidewall of the recess 210 may be removed and the hard mask pattern 206 may be partially removed.

Figure 7:
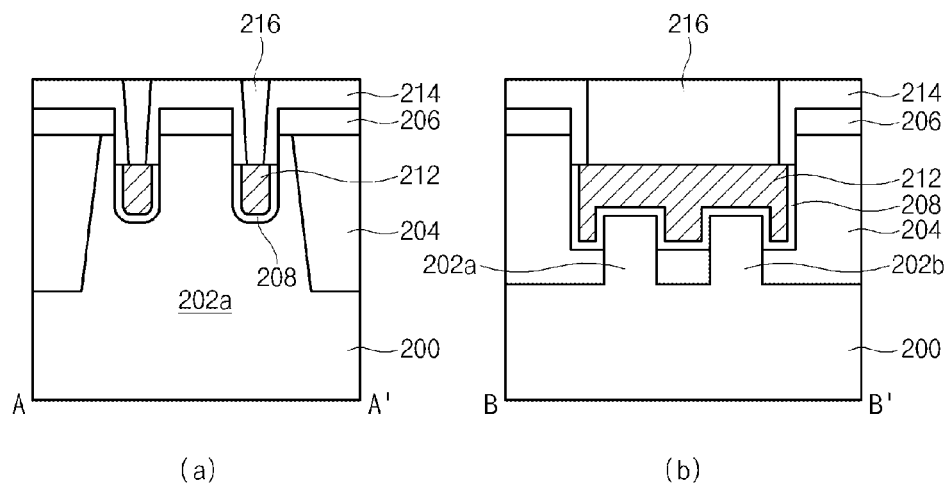

Referring to FIG. 7, a sealing insulating layer 214 is formed on the buried gate 212 and the hard mask pattern 206 to be buried in the recess 210 and then planarized through a chemical mechanical polishing (CMP) process. In an embodiment, the sealing insulating layer 214 may include a nitride layer.

Next, a photoresist pattern (not shown) defining a buried gate contact region is formed on the sealing insulating layer 214 through a photo etching process. In an embodiment, the buried gate contact region is a region corresponding to the buried gate contact indicated by the reference numeral 110 of FIG. 2 and a box-shaped region overlapping the buried gate 212. That is, the buried gate contact region has a box shape which has a length and width similar to or smaller than the buried gate region.

Next, the sealing insulating layer 214 is etched using the photoresist pattern as an etch mask to form a buried gate contact hole, and a conductive material is formed in the buried gate contact hole and then planarized to form a buried gate contact 216.

Figure 8:
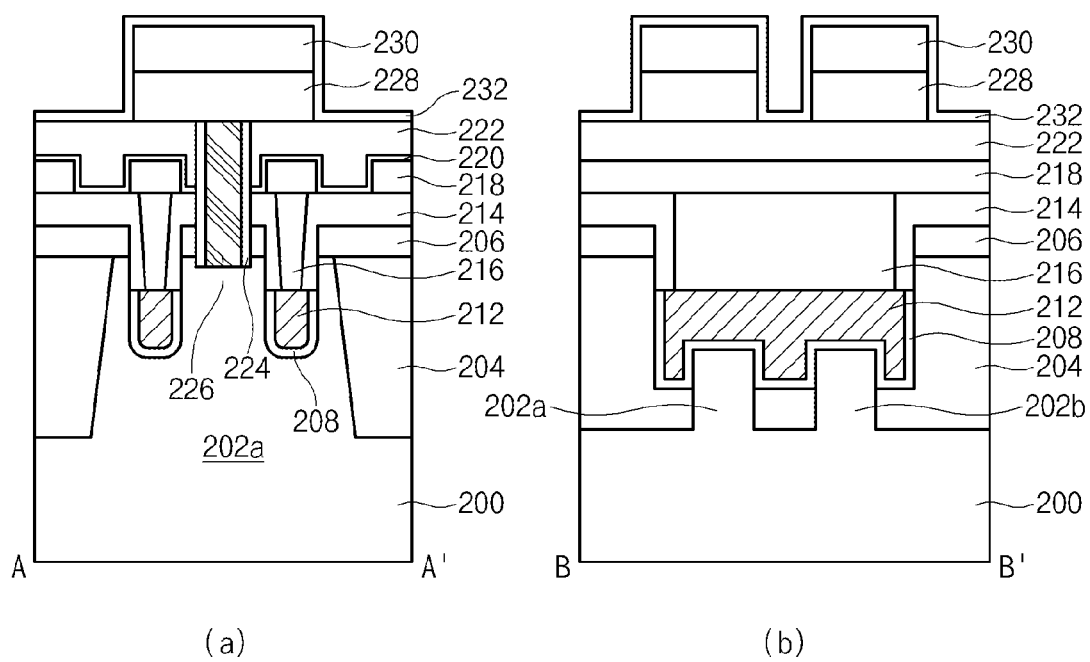

Referring to FIG. 8, a conductive layer (not shown) is formed on the buried gate contact 216 and the sealing insulating layer 214 and then patterned to form a word line 218 connected to the buried gate contact 216. In an embodiment, the word line 218 may be formed to have the same linewidth as the buried gate 212.

Subsequently, an insulating layer 220 for a spacer is formed over an upper surface of the substrate including the word line 218, and an interlayer insulating layer 222 is formed on the insulating layer 220. In an embodiment, the insulating layer 220 for a spacer includes a nitride layer, and an interlayer insulating layer 222 includes an oxide layer.

Next, a photoresist pattern (not shown) defining a bit line contact region is formed on the interlayer insulating layer 222 using a photo etching process. Subsequently, the interlayer insulating layer 222, the insulating layer 220, the sealing insulating layer 214, and the hard mask pattern 206 are etched using the photoresist pattern as an etch mask until a portion of the active region between the buried gates 212 is exposed, so that a bit line contact hole (not shown) is formed.

A spacer 224 is formed on a sidewall of the bit line contact hole and a conductive material is formed in the bit line contact hole to form the bit line contact 226.

Next, a conductive layer (not shown) for a bit line and a hard mask layer (not shown) are formed on the substrate including the bit line contact 226. Subsequently, the conductive layer and the hard mask layer are etched using a mask (not shown) defining a bit line region to form a bit line in which a conductive pattern 228 and a hard mask pattern 230 are stacked. The bit line is connected to the bit line contact 226 and orthogonally crosses the word line 218.

Next, an insulating layer 232 for a spacer is formed on the substrate including the bit line.

Subsequent processes may be performed as in the related art and thus detailed descriptions thereof will be omitted.

According to embodiments of the present invention, a gate is formed not in a line shape, but in a box shape which passes across a limited number of active regions, thereby reducing the passing gate effect and improving characteristics of a cell.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   active regions defined by a device isolation layer;
   gates disposed in cell channel regions of the active regions, each gate extending over only two active regions;
   word lines disposed over the gates and extending in a first direction; and
   gate contacts coupling the gates to the word lines.

2. The semiconductor device of claim 1, further comprising bit lines extending along a second direction to cross the word lines.

3. The semiconductor device of claim 1, wherein two of the active regions that are adjacent to each other in a longitudinal direction are separated by a width extending between adjacent ends of the active regions, and no gate is disposed in the width extending between adjacent ends of the active regions.

4. The semiconductor device of claim 1, wherein each of the gates is formed in a box shape, and each of the two active regions are adjacent along the first direction.

5. The semiconductor device of claim 1, wherein the word lines are disposed over the active regions and the device isolation layer at a fixed distance from the active regions and the device isolation layer.

6. The semiconductor device of claim 1, wherein the gates include buried gates buried in the active regions.

7. The semiconductor device of claim 1, wherein the gates include a fin gate with a lower portion disposed between the two active regions.

8. The semiconductor device of claim 1, wherein the word lines obliquely cross the active regions.

9. A semiconductor device, comprising:
   a first active region, a second active region adjacent to the first active region, and a third active region adjacent to the second active region, each of the first, second, and third active regions defined by a device isolation layer;

a first gate extending over only the first active region and a first channel region of the second active region;

a second gate extending over only the second active region and a first channel region of the third active region;

a first gate contact disposed on the first gate;

a second gate contact disposed on the second gate;

a first word line disposed over the first gate and coupled to the first gate through the first gate contact; and a second word line disposed over the second gate and coupled to the second gate through the second gate contact.

10. The semiconductor device of claim 9, wherein the first gate and second gate include buried gates.

11. The semiconductor device of claim 9, wherein the first gate is formed in a box shape, and the active regions overlapped by the first gate are the first active region and the second active region.

12. The semiconductor device of claim 9, wherein the second gate is formed in a box shape, and the active regions overlapped by the first gate are the second active region and the third active region.

13. The semiconductor device of claim 9, wherein the first gate is a fin gate with a lower portion disposed between sidewalls of the first and second active regions, and the second gate is a fin gate with a lower portion disposed between sidewalls of the second and third active regions.

* * * * *